(12) United States Patent
Kakihara

(10) Patent No.: US 6,314,024 B1
(45) Date of Patent: Nov. 6, 2001

(54) DATA PROCESSING APPARATUS

(75) Inventor: Koji Kakihara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/692,321

(22) Filed: Oct. 20, 2000

(30) Foreign Application Priority Data

Oct. 22, 1999 (JP) .................................................. 11-301211

(51) Int. Cl.[7] ............................. G11C 16/06; G06F 11/00
(52) U.S. Cl. ............................. 365/185.09; 714/2; 714/7
(58) Field of Search ............................. 365/185.09, 200, 365/230.03; 714/1, 2, 7

(56) References Cited

U.S. PATENT DOCUMENTS

| | | | |
|---|---|---|---|
| 4,335,447 | * | 6/1982 | Jerrim .................................... 364/900 |
| 4,361,877 | * | 11/1982 | Dyer et al. ............................ 364/900 |
| 6,105,146 | * | 8/2000 | Tavallaei et al. ...................... 714/2 |

FOREIGN PATENT DOCUMENTS

| | | |
|---|---|---|
| 1-124041 | 5/1989 | (JP) . |
| 4-259046 | 9/1992 | (JP) . |
| 7-64784 | 3/1995 | (JP) . |
| 8-305556 | 11/1996 | (JP) . |

* cited by examiner

Primary Examiner—Son T. Dinh
(74) Attorney, Agent, or Firm—Sughrue, Mion, Zinn, Macpeak & Seas, PLLC

(57) ABSTRACT

A computer apparatus comprises a read-only memory, a non-volatile memory, a random access memory and a controller. The read-only memory is a memory in which a program composed of a plurality of modules each have a particular function is written. The non-volatile memory is a writable memory which stores a replacing module which is formed by correcting an error within a defective module of the program. The random access memory is readable and writable. The controller transfers the replacing module from the non-volatile memory into the random access memory, executes the program written in the read-only memory, reads and executes the replacing module stored in the random access memory, instead of reading the defective module.

11 Claims, 14 Drawing Sheets

DATA PROCESSING APPARATUS

BACKGROUND OF THE INVENTION

1. Field of the Invention

The present invention relates to a data processing apparatus, and, more particularly, to a data processing apparatus executing a program, which is formed by modifying an program having an error and stored in a read-only memory.

2. Description of the Related Art

A basic control program for controlling a data processing apparatus is written in a ROM (Read-Only Memory) installed in the apparatus. After the ROM is installed in the apparatus, patching (correction) of data written in the ROM can not be realized.

When to correct the control program, the ROM itself needs to be exchanged for another ROM. However, exchanging the ROM for another ROM requires extra time and is very time consuming.

Unexamined Japanese Patent Application KOKAI Publication Nos. H1-124041, H8- 305556, H4-259046 and H7-64784 disclose a technique for overcoming the above problems.

A data processing apparatus disclosed in the Unexamined Japanese Patent Application KOKAI Publication No. H1-124041 loads a program stored in a ROM into a RAM, corrects the program in the RAM based on patch data stored in a non-volatile memory, and executes the program. When there is not stored patch data in the non-volatile memory, this data processing apparatus loads the program into the RAM. In this structure, the program needs to be loaded into the RAM before executing the program, thus it is very time consuming. There is only little disclosure of this publication, i.e., there is no specific explanations of how the program is corrected and executed.

According to a technique disclosed in Unexamined Japanese Patent Application KOKAI Publication No. H8-305556, when transferring a program from a ROM into a RAM, correction data is loaded from a non-volatile memory instead of loading the program from the ROM into the RAM, if an address of target program to be read coincides with a registered address. A data processing apparatus disclosed in this publication stores a program in the RAM, even the program has no error, thus it is very time consuming before executing the program.

Unexamined Japanese Patent Application KOKAI Publication No. H4-259046 discloses a data processing apparatus. This apparatus copies a page having a bug within a program stored in a ROM, then corrects the page with the bug and executes the program. According to this technique, the program stored in the ROM is copied into a RAM in the unit of pages. Hence, a program for realizing one particular function may be divided into a plurality of pages. In this case, in order to realize one particular function, both the program stored in the ROM and the program stored in the RAM need to be executed, thus addresses of such programs are complicatedly controlled.

Unexamined Japanese Patent Application KOKAI Publication No. H7-64784 discloses a data processing apparatus. When executing a program stored in a mask ROM, a CPU included in this data processing apparatus skips a portion having a bug within the program, and executes a corrected program stored in a RAM. The data processing apparatus disclosed in this publication needs to refer to addresses of the program stored in different storage mediums one after the other, so that a portion having a bug within the program is not executed. This data processing apparatus needs to carry out a complicated process for controlling the addresses.

The entire disclosures of Unexamined Japanese Patent Application KOKAI Publication Nos. H1-124041, H8-305556, H4-259046 and H7-64784 are incorporated herein by reference.

SUMMARY OF THE INVENTION

The present invention has been made in consideration of the above facts. It is accordingly an object of the present invention to provide a data processing apparatus which can easily correct a program with a bug and execute the program, when the program stored in a read-only memory needs to be corrected.

Another object thereof is to provide a data processing apparatus which does not need to refer to both an address of a program stored in a read-only memory and an address of a copied program stored in a random access memory, in which the program stored in the read-only memory is copied and corrected.

Still another object thereof is to provide a data processing apparatus in which a random access memory storing a target program to be corrected, of programs stored in a read-only memory, has a small storage capacity.

In order to achieve the above objects, according to the first aspect of the present invention, there is provided a data processing apparatus comprising:

- a read-only memory which stores a program composed of a plurality of modules each having a function;
- a writable non-volatile memory storing a replacing module in which an deficiency included in one of the plurality of modules is corrected;
- a random access memory which is readable and writable; and
- a controller which transfers the replacing module from the non-volatile memory into the random access memory, executes the program written in the read-only memory, reads and executes the replacing module stored in the random access memory without reading and executing the module with the deficiency.

According to the above structure, the plurality of modules are included in the program, thus the correction or modification of the program can be performed in the unit of modules. Hence, in this structure, while correcting the bug included in the program, the correction of the program can be achieved.

Each of the non-volatile memory and the random access memory may include a RAM (Random Access Memory) wherein the replacing module may be written.

In order to achieve the above objects, according to the second aspect of the present invention, there is provided a data processing apparatus,

- a read-only memory wherein a program to be executed is written;
- a writable non-volatile memory which stores correction data for correcting a deficiency which is included in the program;
- a random access memory which is readable and writable;
- a controller which copies the program stored in the read-only memory into the random access memory, corrects the deficiency included in the copied program in the random access memory using the correction data stored in the non-volatile memory, reads and executes the program which has been corrected and stored in the random access memory, and wherein the data processing apparatus executes the copied program while referring to an address thereof without referring to an address of the program stored in the read-only memory.

According to the above structure, the deficiency of the program can easily be corrected. Besides, the target program to be executed is copied in the random access memory. Hence, it is not necessary to refer to both of the address of the program stored in the ROM and the address of the program stored in the RAM, one after another. Therefore, the program can be executed while referring only one of the address of the program.

The read-only memory may include a mask ROM (read-only memory).

Each of the non-volatile memory and the random access memory may include a RAM, in one area of which correction data is stored and in other area of which the program to be executed is copied by the controller; and the controller may correct the deficiency included in the copied program using the correction data stored in the one area of the random access memory.

In order to achieve the above objects, according to the third aspect of the present invention, there is provided a data processing apparatus comprising:

a read-only memory which stores a program composed of a plurality of modules each having a function;

a writable non-volatile memory which stores correction data for correcting a deficiency included in the program;

a ramdom access memory which is readable and writable; and a controller which copies one of the plurality of module with the deficiency stored in the read-only memory into the random access memory, corrects the deficiency in the copied module using the correction data stored in the non-volatile memory, executes the program stored in the read-only memory, reads and executes the corrected module stored in the random access memory without reading and executing the module with the deficiency.

Each of the non-volatile memory and the random access memory may include a RAM, in one area of which the correction data is stored and into other area of which the program is copied; and the controller corrects the deficiency included in the copied program using the correction data stored in the one area of the random access memory.

In order to achieve the above objects, according to the fourth aspect of the present invention, there is provided a data processing apparatus comprising:

a read-only memory which stores a program composed of a plurality of equal-sized slots;

a writable non-volatile memory which stores a replacing slot in which a deficiency included in one of the plurality of slots is corrected;

a random access memory which is readable and writable; and a controller which transfers the replacing slot from the non-volatile memory into the random access memory, executes the program stored in the read-only memory, reads and executes the replacing slot stored in the random access memory without reading and executing the slot with the deficiency.

Each of the non-volatile memory and the random access memory may include a RAM wherein the replacing slot is written.

In order to achieve the above objects, according to the fifth aspect of the present invention, there is provided a data processing apparatus comprising:

a read-only memory wherein a program composed of a plurality of equal-sized slots is stored;

a writable non-volatile memory which stores correction data for correcting a deficiency in the program;

a random access memory which is readable and writable; and a controller which transfers one of the plurality of slots having the deficiency from the read-only memory into the random access memory, corrects the transferred slot with the deficiency using the correction data stored in the non-volatile memory, executes the program stored in the read-only memory, and reads out and executes the corrected slot stored in the random access memory without reading and executing the slot with the deficiency.

Each of the non-volatile memory and the random access memory may include a RAM in one area of which the correction data is stored and in other area of which a target program to be executed by the controller is copied; and the controller may correct the deficiency in the copied target program using the correction data stored in the one area of the RAM.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Preferred embodiments of the present invention will now be explained with reference to the accompanying drawings.

First Embodiment

Figure 1:
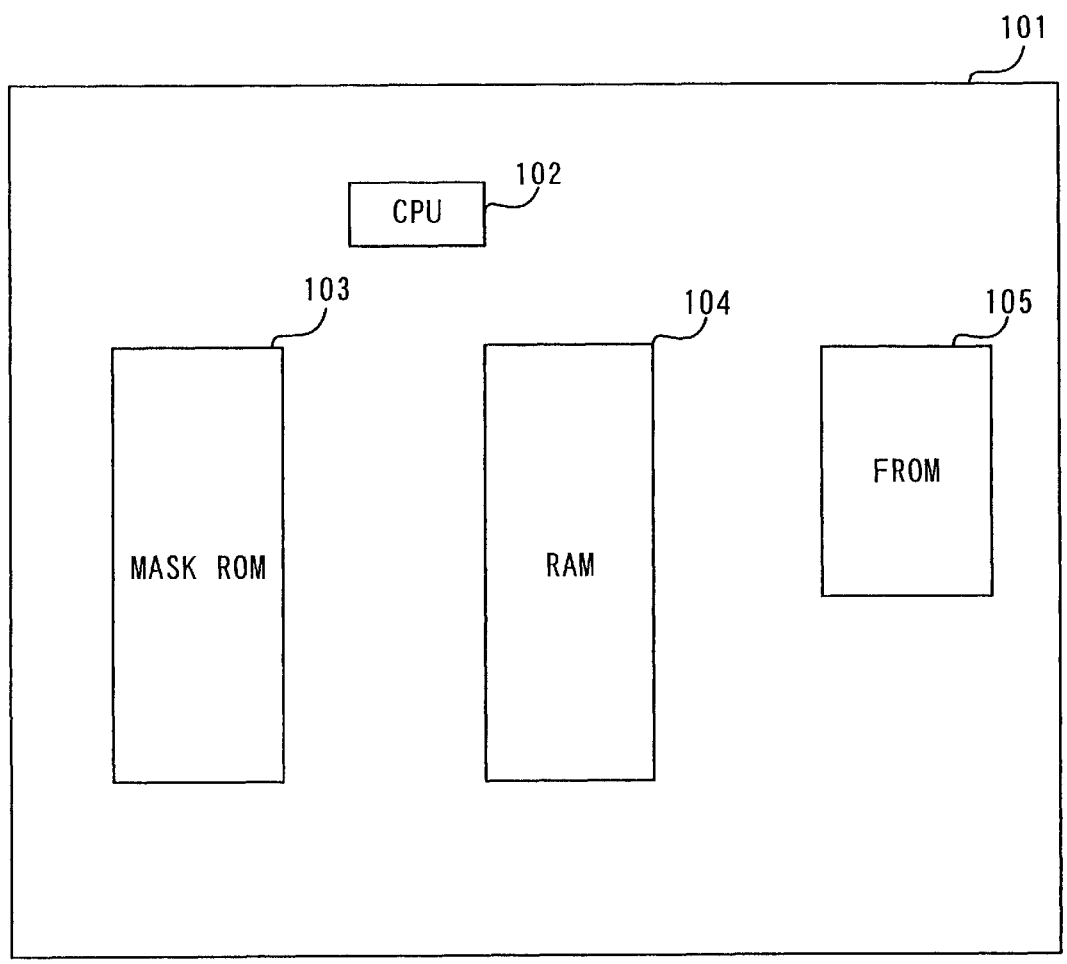
FIG. 1 is a block diagram showing the structure of a computer apparatus according to the first embodiment of the present invention.

FIG. 1 is a block diagram showing the structure of a computer apparatus according to the first embodiment.

A computer apparatus 101 comprises a CPU 102, a mask ROM 103, a RAM 104 and a flash ROM 105.

A CPU 102 executes a program which is written in the mask ROM 103.

A program is permanently stored in the mask ROM 103 during the manufacturing process. The installed program is composed of a plurality of modules.

One module is a developed program unit for realizing a predetermined function, and has a program size in a range approximately between a few KB (K-bytes) and 100KB.

The RAM 104 is read-write memory, and stores various data.

The flash ROM (hereinafter referred to as an FROM) 105 is a read-only memory which is electrically erasable and programmable in the unit of blocks. The FROM 105 can retain stored data even when power is removed from the computer apparatus.

The FRAOM 105 stores a replacing module, which is used for replacing a module having a bug (error) in the program which is stored in the mask ROM 103. The stored module can be updated at any time required.

The replacing module is one, from which any error or bug is removed, prepared for replacing a module having a bug in any instructions and data (hereinafter referred to simply as data).

Operations of the computer apparatus according to the first embodiment of the present invention will now be explained with reference to FIG. 2.

Figure 2:
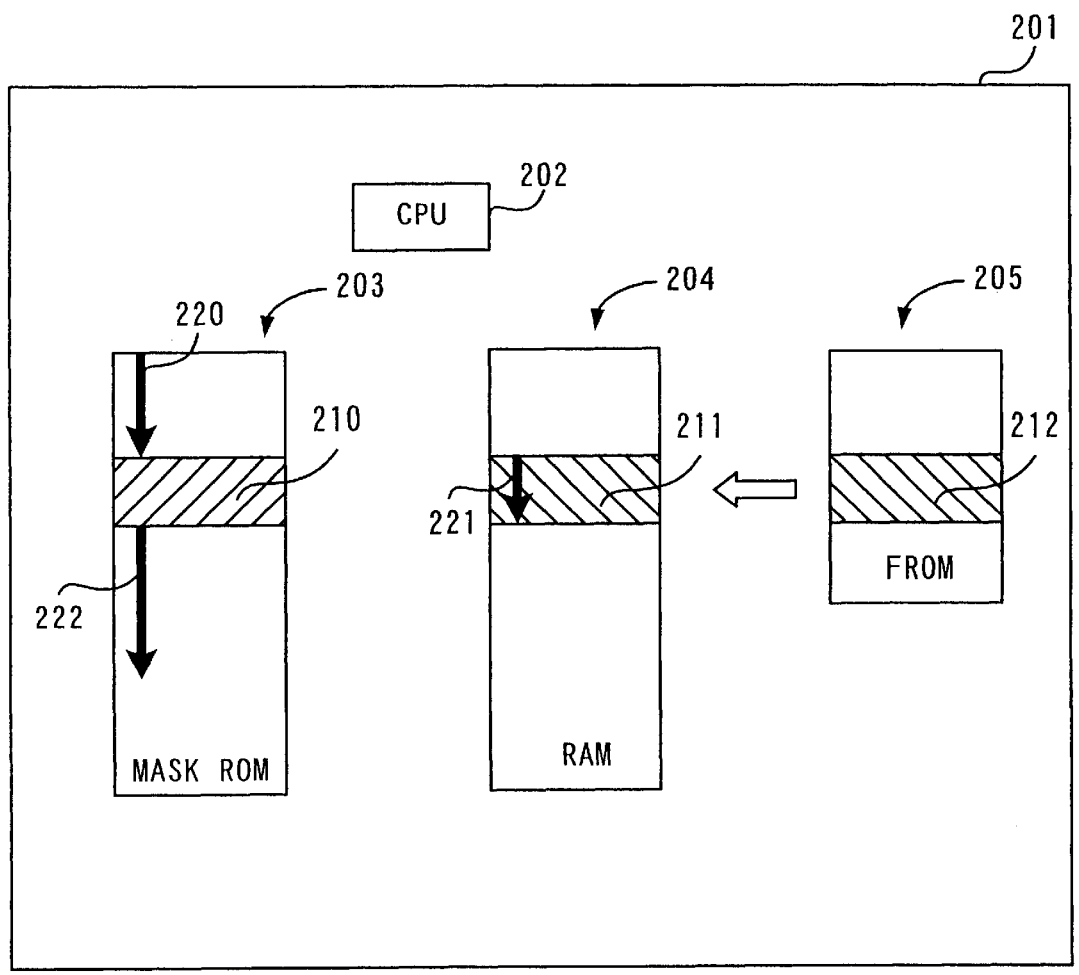
FIG. 2 is a schematic diagram for explaining operations of the computer apparatus.

A computer apparatus 201, shown in FIG. 2, a CPU 202, a mask ROM 203, a RAM 204 and an FROM 205 respectively correspond to the computer apparatus 101, the CPU 102, the mask ROM 103, the RAM 104 and the FROM 105 shown in FIG. 1.

The computer apparatus 201, discriminates whether any program is stored in the FROM 205. When discriminated that a program is stored therein, the computer apparatus 201 functions for loading the stored program into the RAM 204.

The CPU 202 has a function for reading and executing programs stored in the RAM 204.

Suppose that a program stored in the mask ROM 203 has a bug (error) in one original module 210 in the program.

The original module 210 from which the bug is removed is stored in the FROM 205 as a replacing module 211.

Figure 3:
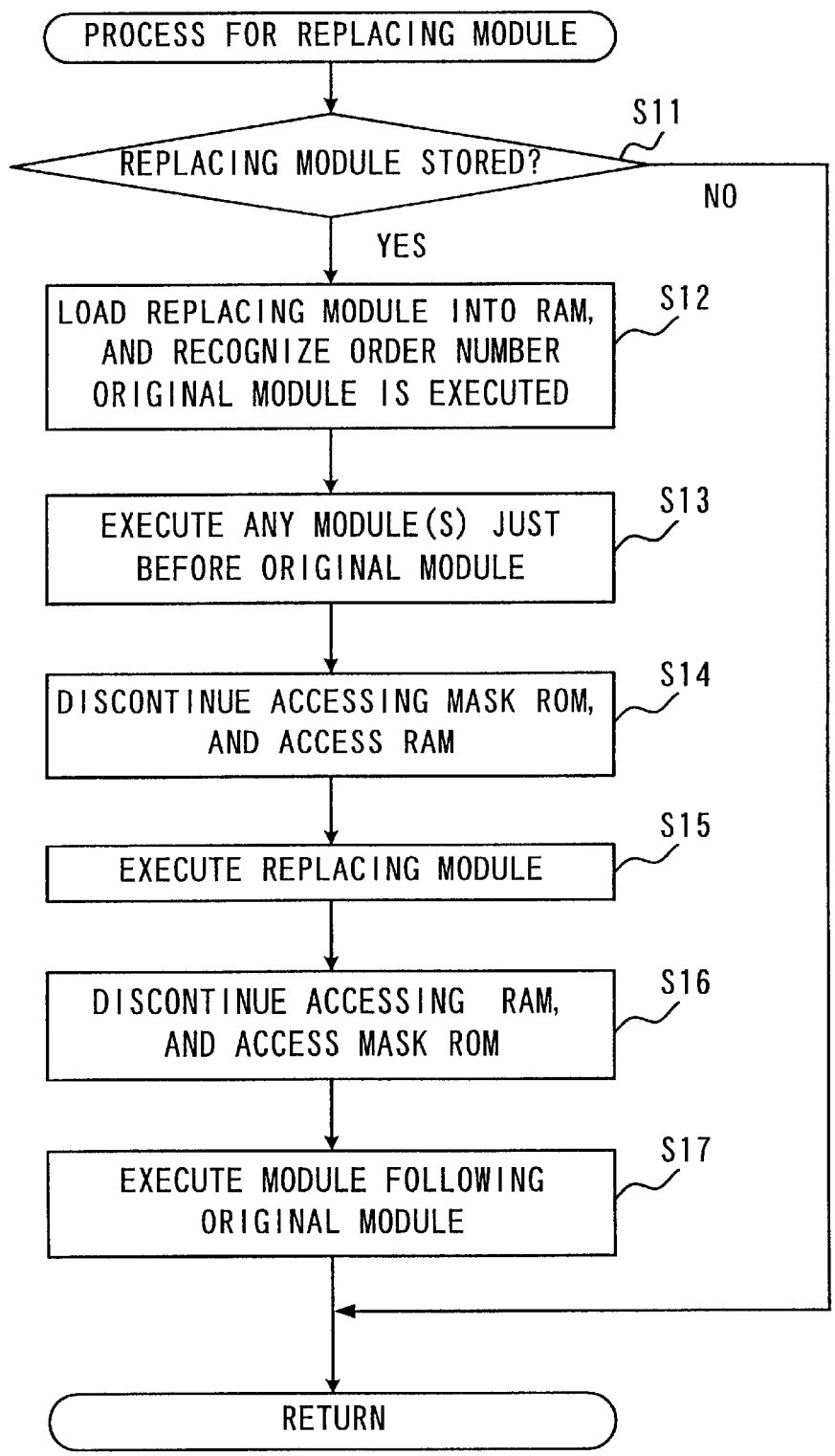
FIG. 3 is a flowchart showing the flow of a process for replacing a module, which is carried out in the computer apparatus.

FIG. 3 is a flowchart showing the flow of a process for replacing a module.

The computer apparatus 201 carries out the process for replacing a module, as shown in FIG. 3, after a power source is supplied thereto.

The CPU 202 discriminates whether the replacing module 211 is stored in the FROM 205 (Step S11). In Step S11, when discriminated that the replacing module 211 is not stored, the process is terminated.

In Step S11, when discriminated that the replacing module 211 is stored therein, the CPU 202 loads the replacing module 211 into the RAM 204, and recognizes the order number in which the original module 210 having a bug is executed sequentially from the head module in the stored program (Step S12).

When executing the program, the CPU 202 starts reading the program stored in the mask ROM 203, and executes the head module to one just before the original module 210 within the program, in accordance with a program order 220 (Step S13).

Then, the CPU 202 discontinues accessing the mask ROM 203, and accesses the RAM 204 (Step S14).

The CPU 202 reads out and executes the replacing module 211 stored in the RAM 204 sequentially from the address of the replacing module 211 (step S15).

After this, the CPU 202 discontinues accessing the RAM 204, and accesses the mask ROM 203 again (Step S16).

The CPU 202 reads out and executes a module following the original module 210, sequentially from the address of the following module, in accordance with a program order 222 (Step S17).

As explained, the computer apparatus 201 skips the original module 210 with a bug, and executes the replacing module 211 stored in the RAM 204, thereby to replace the module stored in the mask ROM 203.

Second Embodiment

The computer apparatus according to the first embodiment replaces the module having a bug with a correctly-programmed module, when to correct and execute the program in the mask ROM.

Explanations will now be made to a computer apparatus according to the second embodiment. In the computer apparatus, the storage contents of a mask ROM are all replaced, in the structure where the storage capacity of the mask ROM is relatively small.

The computer apparatus according to the second embodiment has substantially the same structure as that of the computer apparatus of the first embodiment, Thus, only the component elements which are distinctive from that of the computer apparatus of the first embodiment will now be described.

Operations of the computer apparatus according to the second embodiment will now be explained with reference to FIG. 4.

Figure 4:
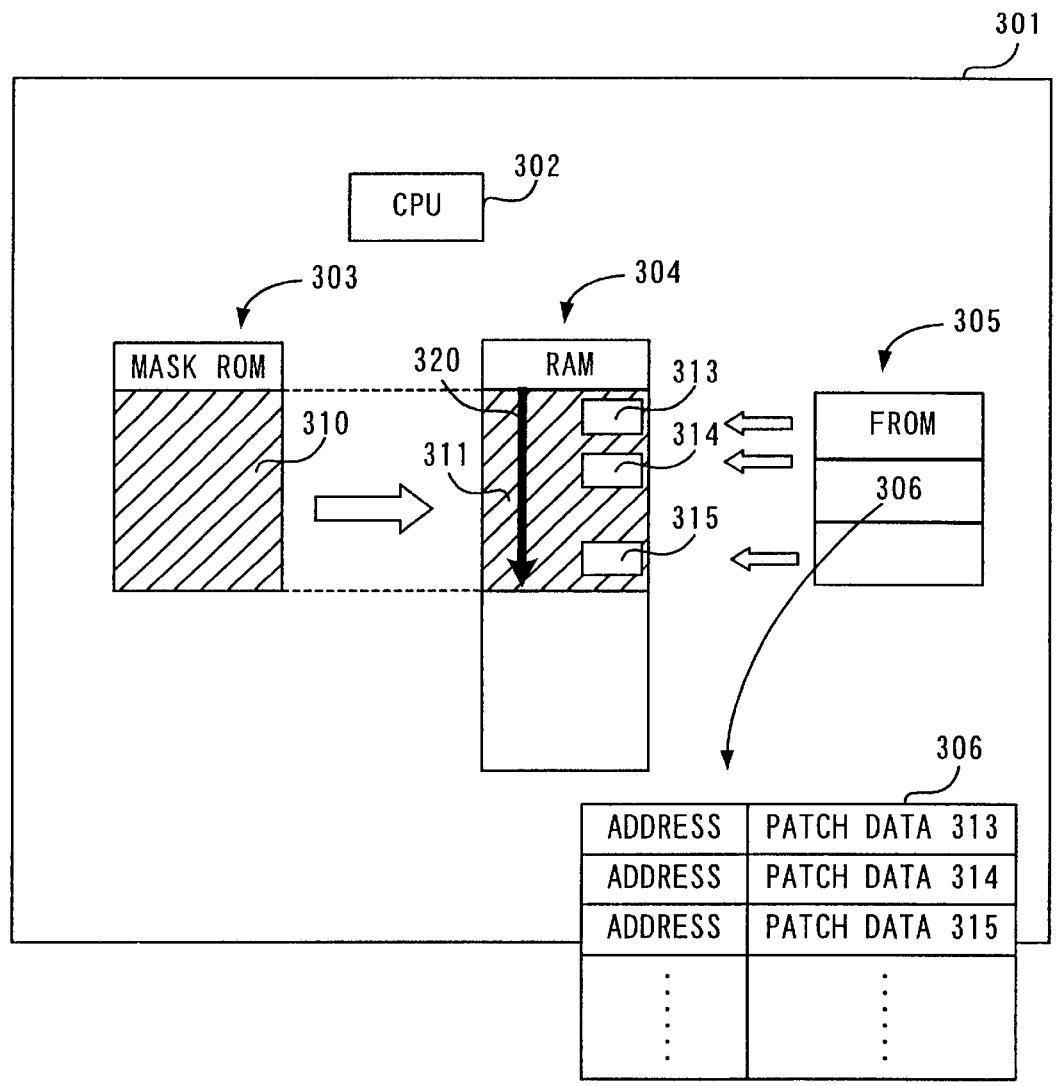
FIG. 4 is an exemplary diagram for explaining operations of a computer apparatus according to the second embodiment.

A computer apparatus 301, a CPU 302, a mask ROM 303, a RAM 304 and an FROM 305, shown in FIG. 4, correspond to the computer apparatus 101, the CPU 102, the mask ROM 103, the RAM 104 and the FROM 105, respectively.

The computer apparatus 301 discriminates whether there is stored a patch data table 306 in the FROM 305. When discriminated that the patch data table 306 is stored therein, the computer apparatus 301 copies a program stored in the mask ROM 303 entirely, and stores the copied program in the RAM 304.

The patch data table 306 includes addresses of target data to be corrected and replacing data with which the target data is replaced, as illustrated in FIG. 4.

The computer apparatus 301 reads out the patch data table 306 stored in the FROM 305, and has a function for adding patch to data included in the program stored in the RAM 304.

The CPU 302 reads out and executes the patched data in the program stored in the RAM 304.

The data amount of the patch data table 306 stored in the FROM 305 is in a range between a few bytes and a few hundred bytes.

Figure 5:
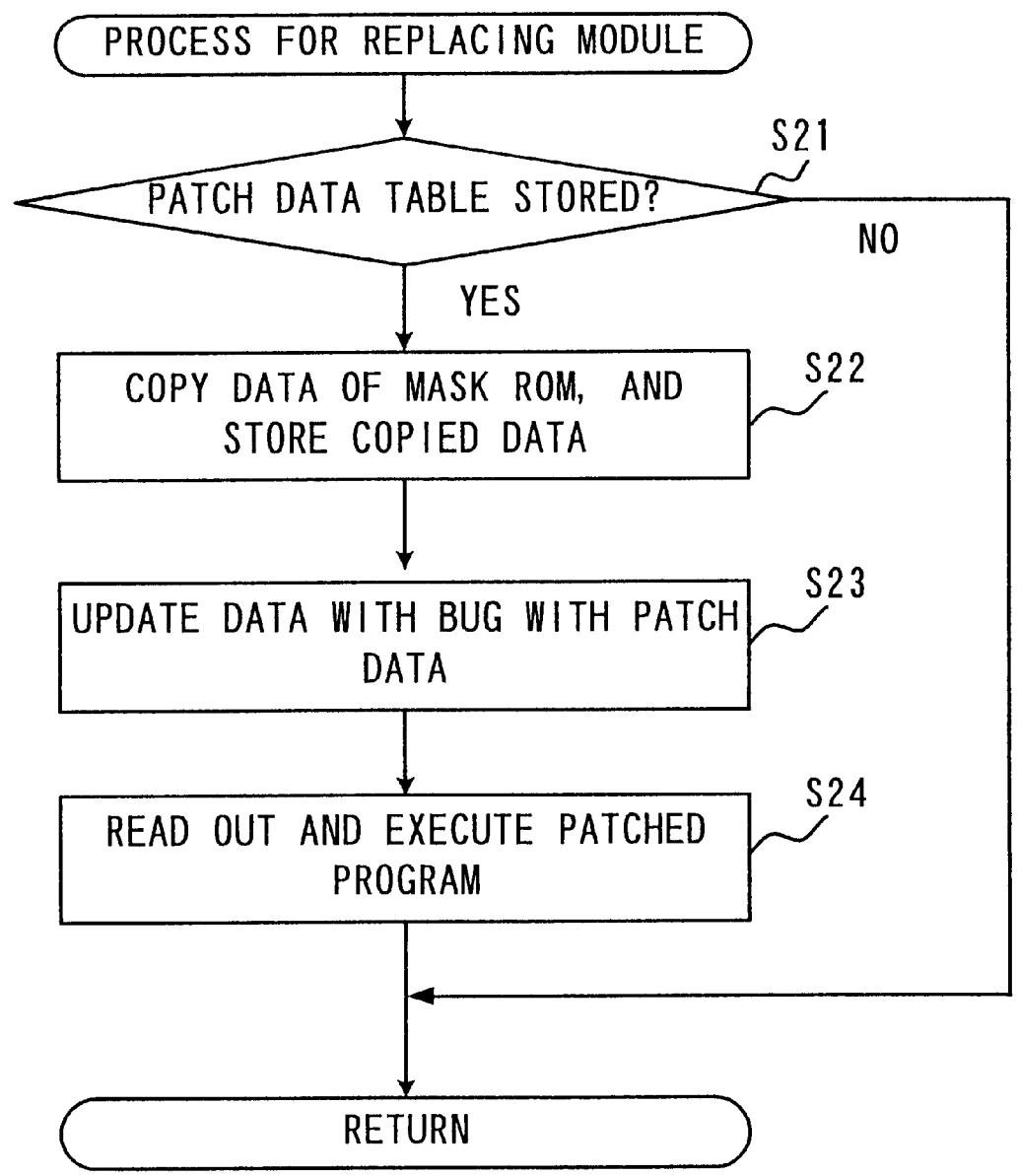
FIG. 5 is a flowchart showing the flow of a process for replacing a module, which is carried out in the computer apparatus according to the second embodiment.

FIG. 5 is a flowchart showing the flow of a process for replacing a program stored in the computer apparatus according to the second embodiment.

After a power source is supplied, the computer apparatus 301 carries out the process for replacing a program, as shown in FIG. 5.

The CPU 302 discriminates whether there is stored the patch data table 306 in the FROM 305 (Step S21). In Step S21, when discriminated that there is stored no patch data table 306, the process is terminated.

In Step S21, when discriminated that the patch data table 306 is stored therein, the CPU 302 copies the program 310 stored in the mask ROM 303 entirely, and stores the copied program as a copied program 311 in the RAM 304 (Step S22).

The CPU 302 reads out the patch data table 306 stored in the FROM 305, and overwrites the data having a bug within the program stored in the RAM 304 using patch data 313, 314, 315, on the basis of the read patch data table 306 (Step S23).

The CPU 302 reads out and executes the corrected program 311 (Step S24).

As described above, the computer apparatus 301 executes the proper program from which the bug is removed, thereby to replace the program having the bug with the proper program.

Third Embodiment

The computer apparatus according to the second embodiment copies the entire programs stored in the mask ROM, and corrects the data included in the program.

Explanations will now be made to a computer apparatus according to the third embodiment of the present invention. In the computer apparatus of this embodiment, modules forming a program stored in the mask ROM are copied, and the copied modules are patched.

The computer apparatus according to the third embodiment has the same structure as that of the second embodiment. Thus, only the component elements which are distinctive from those of the computer apparatus of the first embodiment will now be described.

Figure 6:
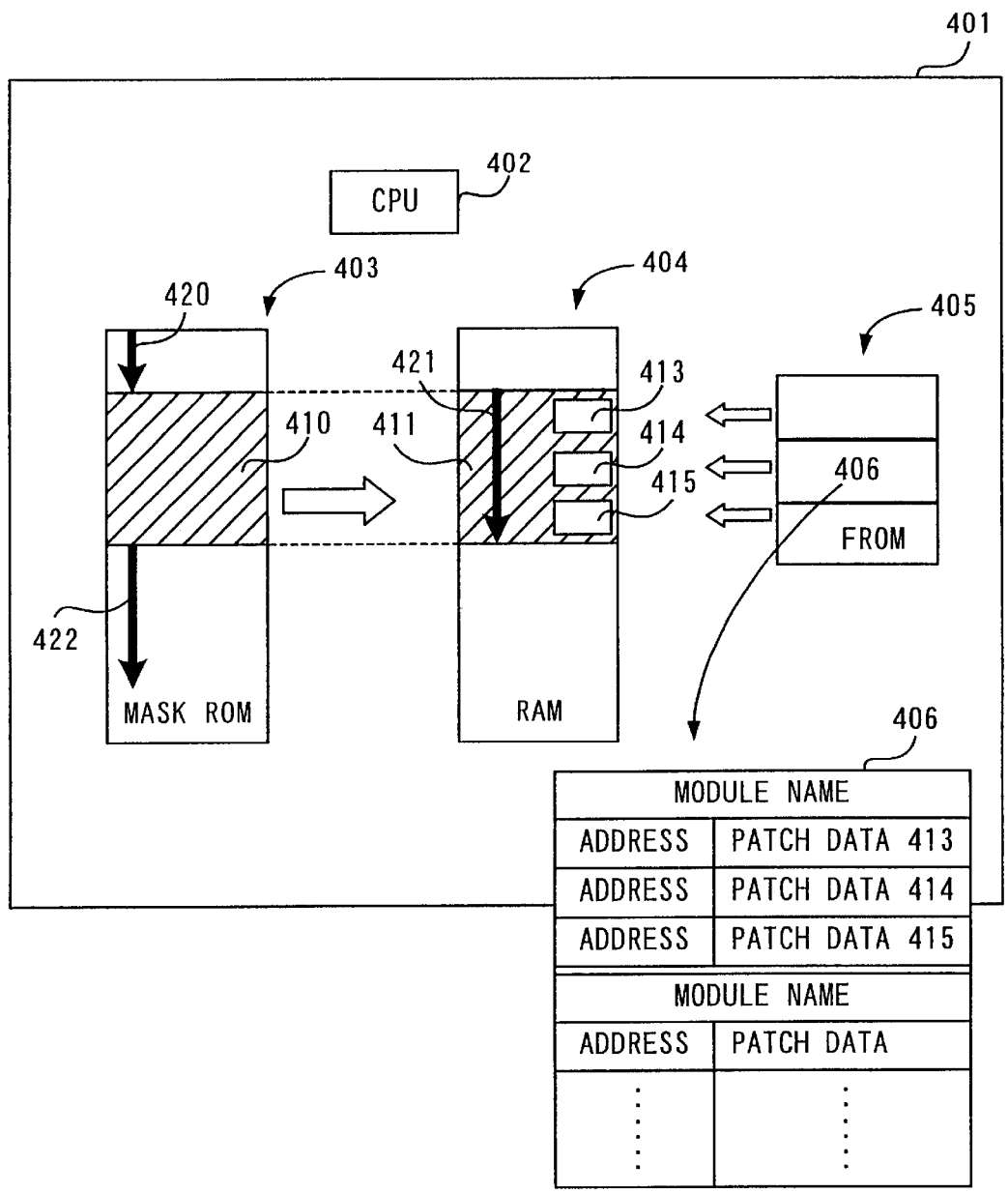
FIG. 6 is an exemplary diagram for explaining operations of a computer apparatus according to the third embodiment.

FIG. 6 is an exemplary diagram for explaining operations of the computer apparatus according to the third embodiment.

A computer apparatus 401, a CPU 402, a mask ROM 403, a RAM 404 and an FROM 405 illustrated in FIG. 6 correspond to the computer apparatus 101, the CPU 102, the mask ROM 103, the RAM 104 and the FROM 105 illustrated in FIG. 1, respectively.

The computer apparatus 401 discriminates whether there is stored a patch data table 406 in the FROM 405.

As shown in FIG. 6, the patch data table 406 includes names of modules, addresses of target data to be patched and patch data with which the target data is patched and replaced, in association with each other in the form of a table. When discriminated that the patch data table 406 is stored therein, the computer apparatus 401 copies a module having a bug from the mask ROM 403, and stores the copied module in the RAM 404.

The computer apparatus 401 reads out the patch data table 406 in the FROM 405, and patches a deficiency of a program stored in the RAM 404.

The CPU 402 reads out and executes the program having the patched data stored in the RAM 404.

Figure 7:
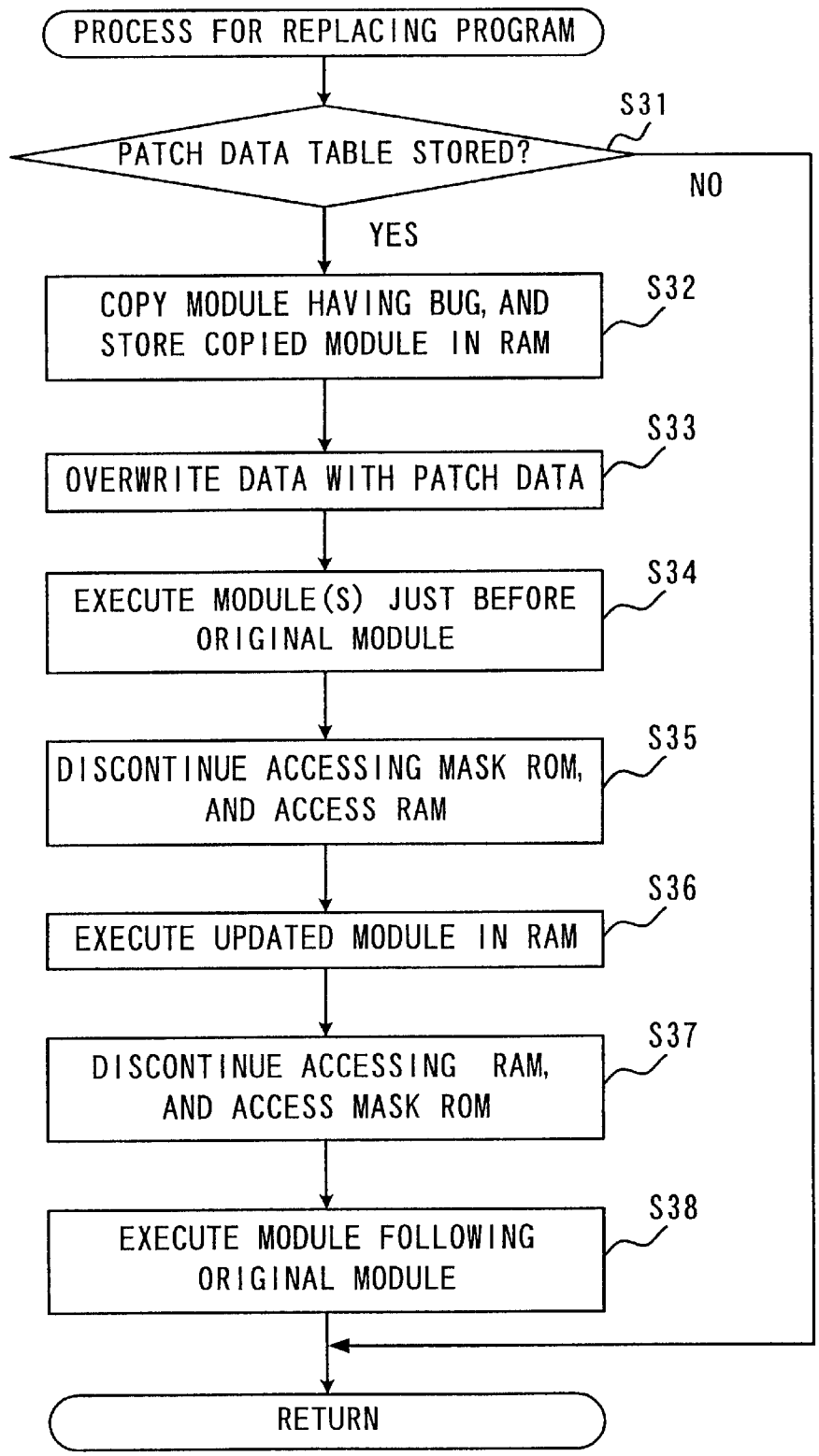
FIG. 7 is a flowchart showing the flow of a process for replacing a module, which is carried out in the computer apparatus of the third embodiment.

FIG. 7 is a flowchart showing the flow of a process for replacing a program stored in the computer apparatus according to the third embodiment.

After a power source is supplied, the computer apparatus 401 carries out the process for replacing the program, as shown in FIG. 7.

The CPU 402 discriminated whether there is stored the patch data table 406 in the FROM 405 (Step S31).

When discriminated that the patch data table 406 is stored in the FROM 405, the CPU 402 copies a module having a bug stored in the mask ROM 403, and stores the copied module as a copied module 411 in the RAM 404 (Step S32).

The CPU 402 reads out the patch data table 406 stored the FROM 405, corrects the copied module 411 in the RAM 404 based on the read table 406, and updates the module having a bug with patch data 413, 414 and 145 (Step S33).

Then, the CPU 402 starts reading the program stored in the mask ROM 403, and executes the head module to one just before the module 410 in accordance with a program order 420 (Step S34).

The CPU 402 discontinues accessing the mask ROM 403, and accesses the RAM 404 (Step S35).

The CPU 402 refers to an address of the module 411 stored in the RAM 404, reads out an executes the module 411, in accordance with a program order 421 (Step S36).

Then, the CPU 402 discontinues accessing the RAM 404, and accesses the mask ROM 403 again (Step S37).

The CPU 402 reads out and executes a module following the module 410, while referring to an address of the module, in accordance with a program order 422 (step S38).

As described above, the computer apparatus 401 reads out and executes the corrected module stored the RAM 404, thereby to execute a proper module from which the bug is removed.

According to the third embodiment, less power is consumed by the FROM than that consumed in the first embodiment, and the RAM needs only small storage capacity as compared to that employed in the second embodiment.

Fourth Embodiment

The data processing apparatus according to the third embodiment reads out the module written in the mask ROM, writes the read module in the RAM, and corrects the module.

Explanations will now be made to a computer apparatus according to the fourth embodiment of the present invention. In this computer apparatus, a smaller amount of data is written in a RAM than an amount of data written in the RAM of the computer apparatus of the third embodiment.

The computer apparatus according to the fourth embodiment has substantially the same structure as that of the first embodiment. Hence, only the component elements which are distinctive from those of the first embodiment will now be explained.

Operations of the computer apparatus of the fourth embodiment will now be described with reference to FIG. 8.

Figure 8:
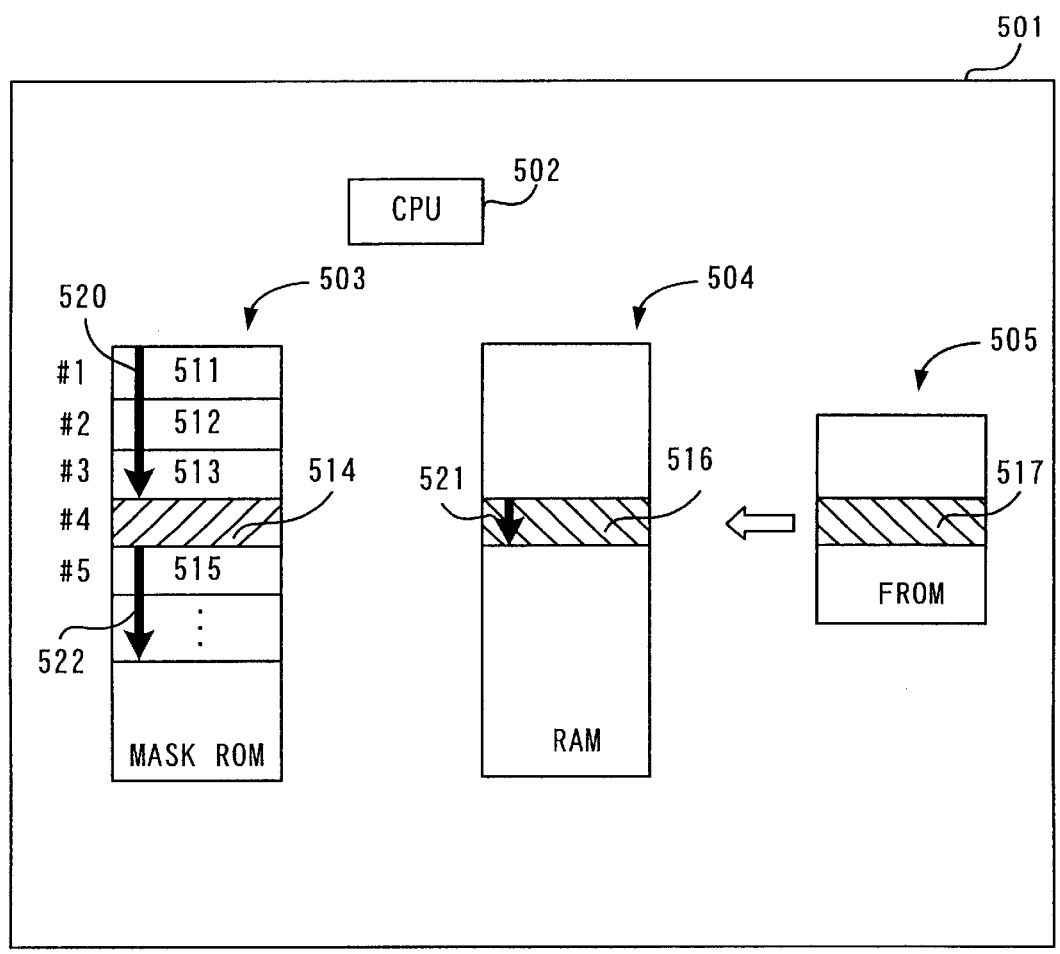
FIG. 8 is an exemplary diagram for explaining operations of a computer apparatus according to the fourth embodiment.

A computer apparatus 501, a CPU 502, a mask ROM 503, a RAM 504 and an FROM 505 shown in FIG. 8 correspond to the computer apparatus 101, the CPU 102, the mask ROM 103, the RAM 104 and the FROM 105 shown in FIG. 1.

The computer apparatus 501 discriminates whether there is stored a replacing slot in the FROM 505.

When discriminated that there is stored a replacing slot therein, the computer apparatus 501 reads out the replacing slot stored in the FROM 505.

The CPU 502 reads out and executes the replacing slot stored in the RAM 504.

The mask ROM 503 stores a program which is divided into a plurality of slots (respectively being identified with the numbers of "1", "2", . . . , in ascending order) each of which includes 128 byte data.

The RAM 504 stores a program which is divided into a plurality of slots (respectively being identified with the numbers of "1", "2", . . . , in ascending order) each of whose data size is equal to the size of the slots of the program stored in the mask ROM 503. Each of the slots of the program in the RAM 504 can replace an arbitrary one of the slots of the program in the mask ROM 503.

When a bug is found in a slot of the program stored in the mask ROM 503, the FROM 505 stores the replacing slot which can be updated any time required.

Figure 9:
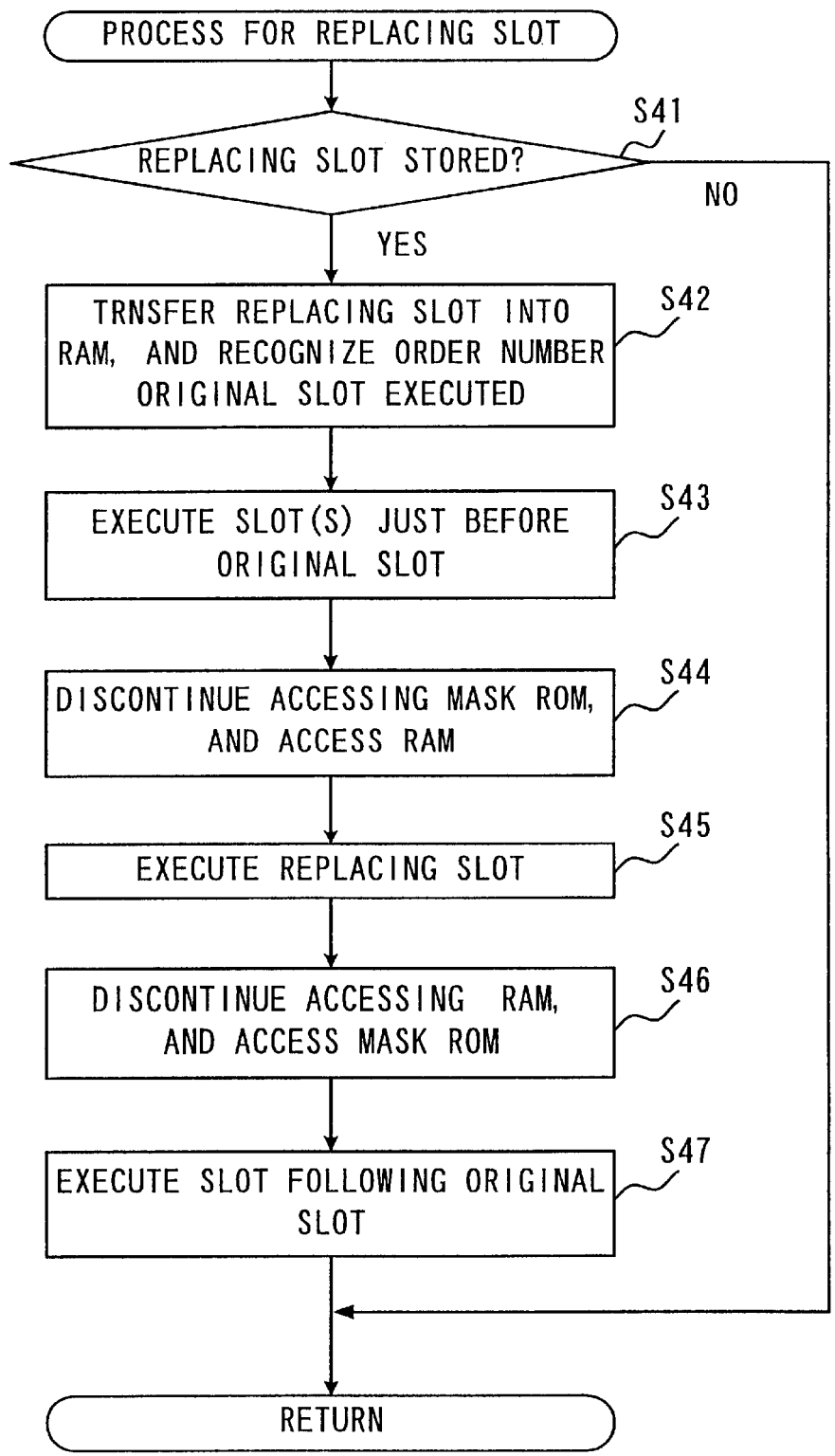
FIG. 9 is a flowchart showing the flow of a process for replacing a module, which is carried out in the computer apparatus of the fourth embodiment.

FIG. 9 is a flowchart showing the flow of a process for replacing a slot, which is carried out in the computer apparatus according to the fourth embodiment.

After a power source is supplied, the computer apparatus 501 carries out the process shown in FIG. 9.

The CPU 502 discriminates whether there is stored a replacing slot 517 in the FROM 305 (Step S41). When discriminated that the replacing slot 517 is not stored therein in Step S41, the process for replacing a slot is terminated.

When discriminated that the replacing slot 517 is stored therein in Step S41, the CPU 502 loads a replacing slot 516 into the RAM 504, and recognizes the order number in which an original slot 514 having a bug is executed sequentially from the head slot in the stored program (Step S42).

When to execute the program, the CPU 502 starts reading the program stored in the mask ROM 503, and executes the head slot to one just before the original slot 514 within the program, in accordance with a program order 520 (Step S43)

Then, the CPU 502 discontinues accessing the mask ROM 503, and accesses the RAM 504 (Step S44).

The CPU 502 refers to an address representing the position of the replacing slot 516 loaded into the RAM 504, reads out and executes the replacing slot 516 in accordance with a program order 521 (Step S45).

The CPU 502 discontinues accessing the RAM 504, and accesses again the mask ROM 503 (Step S46).

The CPU 502 reads out and executes a slot following the original slot 514, while referring to an address of the following slot, in accordance with a program order 522 (Step S47).

As explained above, the computer apparatus 501 skips the original slot 514 having a bug, and executes the replacing module 516 stored in the RAM 504, thereby to replace the module stored in the mask ROM 503.

Fifth Embodiment

In the computer apparatus according to the fourth embodiment, when to correct the slot with a bug in the mask ROM, the replacing slot which has been prepared in advance is executed instead of executing the slot with a bug.

In a computer apparatus according to the fifth embodiment, a slot having a bug is copied in a RAM and corrected afterwards. Explanations will now be made to such a computer apparatus of the fifth embodiment.

The computer apparatus according to the fifth embodiment has substantially the same structure as that of the first embodiment. Hence, only the component elements which are distinctive from those of the first embodiment will now be explained.

Figure 10:
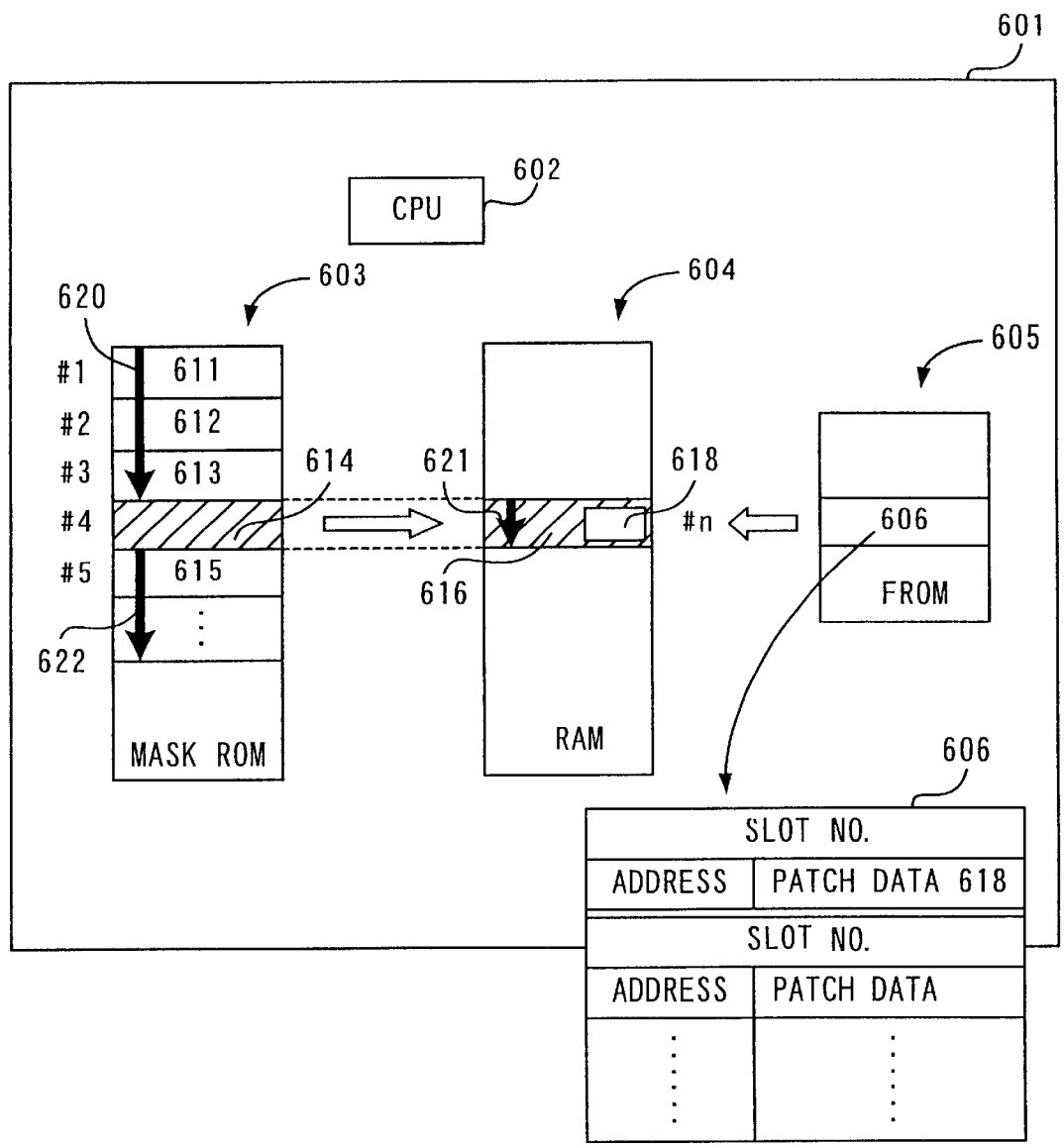
FIG. 10 is a schematic diagram for explaining operations of a computer apparatus according to the fifth embodiment.

FIG. 10 is an exemplary diagram for explaining operations of the computer apparatus according to the fifth embodiment.

A computer apparatus 601, a CPU 502, a mask ROM 603, a RAM 604 and an FROM 605 illustrated in FIG. 10 correspond to the computer apparatus 101, the CPU 102, the mask ROM 103, the RAM 104 and the FROM 105 illustrated in FIG. 1.

The computer apparatus 601 discriminates whether there is stored a patch data table 617 in the FROM 605. The computer 601 copies data of one slot of the program stored in the mask ROM 603 based on the patch data table 617, and stores the copied data in the RAM 604.

The patch data table 617 includes, as illustrated in FIG. 10, slot numbers, addresses and patch data with which target data to be patched is replace and patched, in association with each other.

The computer apparatus 601 reads out the patch data table 617 stored in the FROM 605, and patches the data of the slot in the RAM 604.

The CPU 602 reads out and executes the patched data of the slot in the RAM 604.

As suggested above, the mask ROM 603 stores a program divided into a plurality of slots (respectively being identified with the numbers of "1", "2", . . . , in ascending order) each of which includes 128 byte data.

The RAM 604 stores a program divided into a plurality of slots (respectively being identified with the numbers of "1", "2", . . . , in ascending order) each of which includes 128 byte data and can replace an arbitrary one of the slots in the mask ROM 603.

The FROM 605 stores the patch data table 617.

Figure 11:
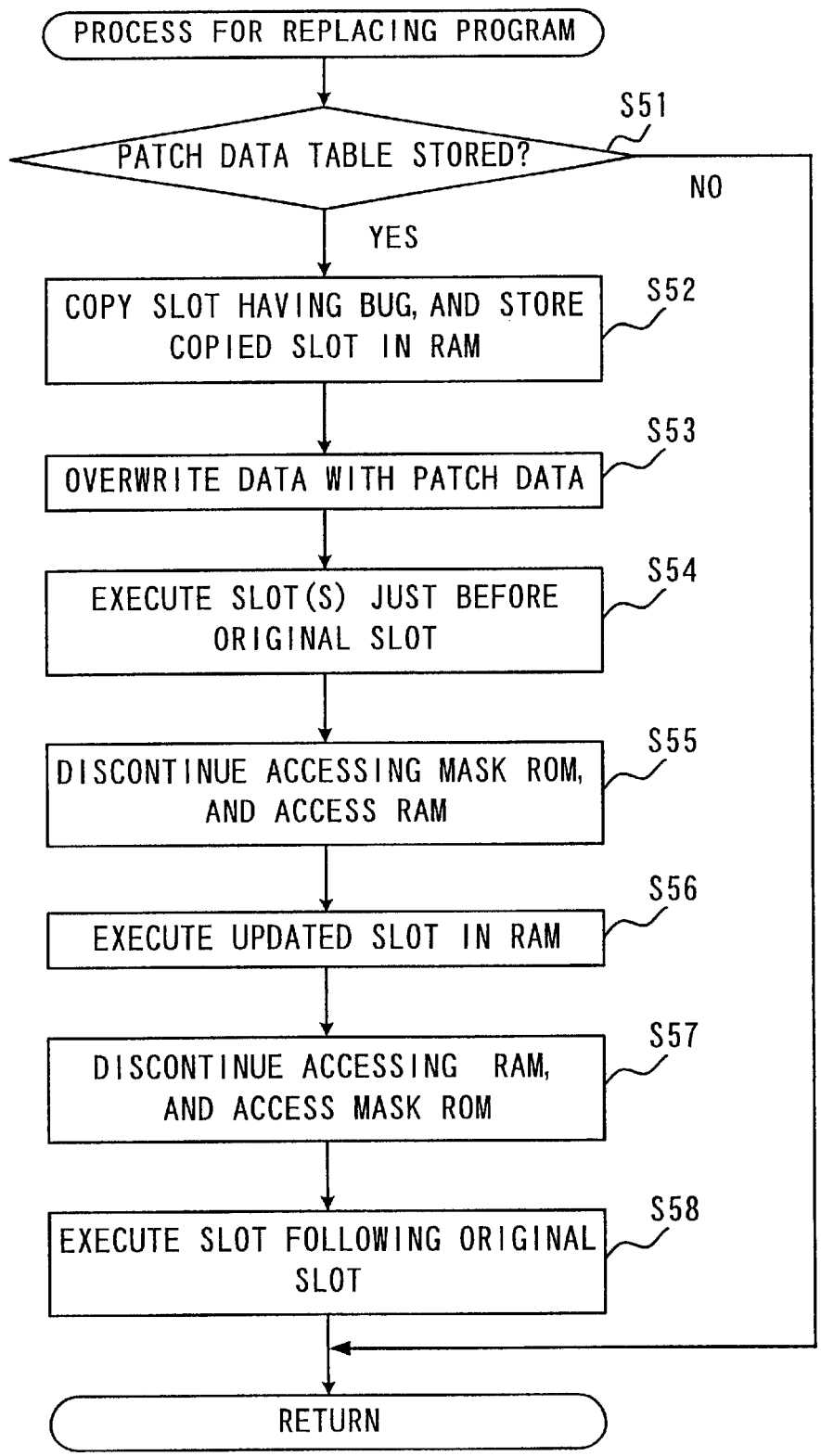
FIG. 11 is a flowchart showing the flow of a process for replacing a slot, which is carried out in the computer apparatus of the fifth embodiment.

FIG. 11 is a flowchart showing the flow of a process for replacing a program in the computer apparatus according to the fifth embodiment of the present invention.

After a power source is supplied, the computer apparatus 601 carries out the process for replacing a program, as shown in FIG. 11.

The CPU 602 discriminates whether there is stored the patch data table 617 in the FROM 605 (Step S51). When discriminated that the patch data table 606 is not stored therein, the process is terminated.

When discriminated that the patch data table 617 is stored therein, the CPU 602 copies a slot 614 with a slot number of "4", and reads out and executes the slot 614, based on the patch data table 617, and stores the copied slot 614 as copied slot 616 in the RAM 604 (Step S52).

Then, the CPU 602 reads out the patch data table 617 stored in the FROM 605, and overwrites the copied slot 616 with patch data 618 (Step S53).

When executing a program, the CPU 602 reads out slots respectively with slot numbers of "1" to "3" in the mask ROM 603, and executes the read slots in accordance with a program order 620 (Step S54).

The CPU 602 discontinues accessing the mask ROM 603, and accesses the RAM 604 (Step S55).

The CPU 602 reads out the slot 616 which has been corrected in the RAM 604, and executes the read slot 616 in accordance with a program order 621 (Step S56).

The CPU 602 discontinues accessing the RAM 604, and accesses the mask ROM 603 again (Step S57).

The CPU 602 then reads out the slot 615 with a slot number of "5", and executes the read slot 615 in accordance with a program order 622 (Step S58).

As described above, the computer apparatus 601 reads out and executes the updated slot from the RAM 604, thereby to execute a proper program having no bugs.

According to the fifth embodiment of the present invention, less power is consumed by the FROM than in the fourth embodiment, and the RAM needs only small storage capacity as compared to that of the third embodiment.

The explanations have been made to the computer apparatuses, according to the first to fifth embodiments, comprising the CPU, the mask ROM, the RAM and the FROM. A modification of the computer apparatus having different structure will now be described by way of example.

For example, as illustrated in FIG. 2, the FROM 205 included in the computer apparatus 201 according to the first embodiment stores the replacing module 212. In this structure, the CPU 202 reads out the replacing module 212 stored in the FROM 205 and transfers the read module 212 into the RAM 204.

In a modification of the first embodiment, explanations will now be made to a computer apparatus which stores in advance a replacing module 211 in the RAM 204.

Figure 12:
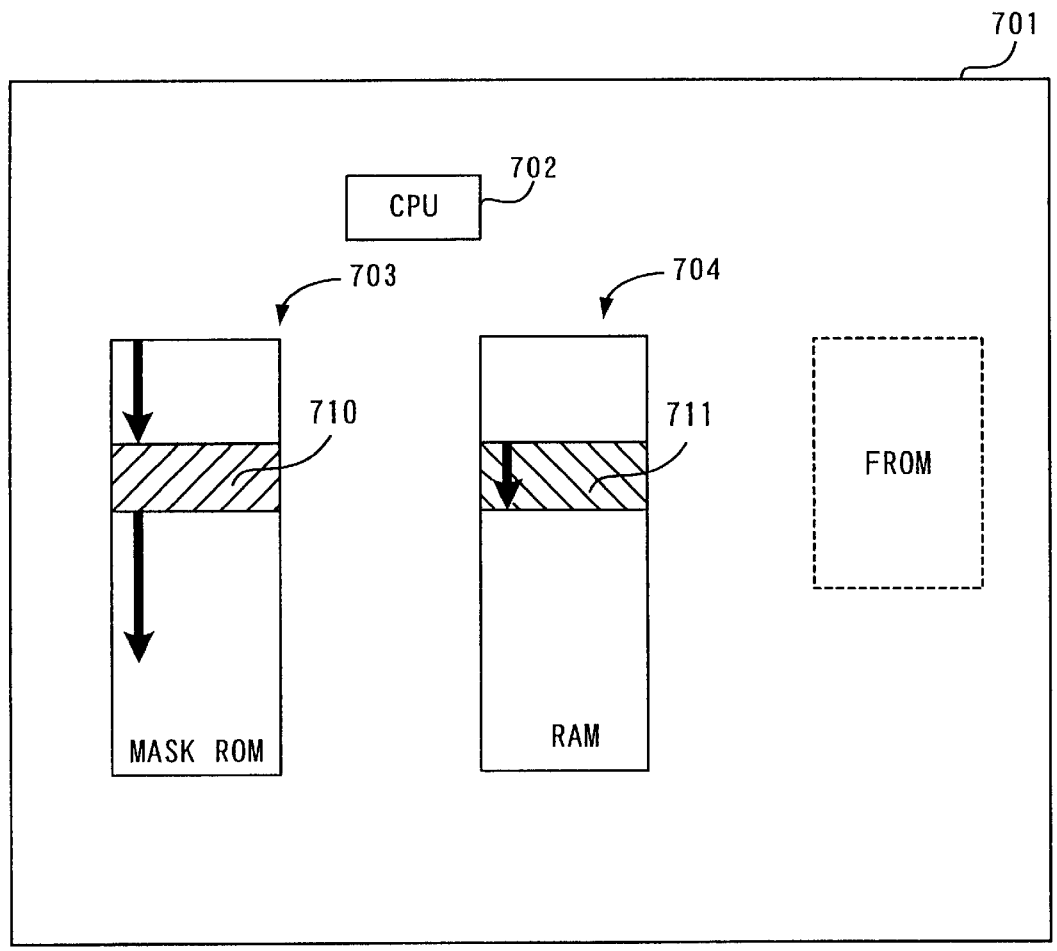
FIG. 12 is a block diagram for explaining operations of a computer apparatus according to a modification of the first embodiment.

A computer apparatus 701, as illustrated in FIG. 12, comprises a CPU 702, a mask ROM 703, and a RAM 704. Note that the RAM 704 is a non-volatile RAM.

After a power source is supplied, the CPU 702 reads out a replacing module 711 stored in the RAM 704, and recognizes the position of an original module 710 having a bug.

When to execute a program stored in the mask ROM 703, the computer apparatus 701 operates in the same manner as explained in the first embodiment. Before executing the program, there is no need to transfer the replacing module.

Thus, the computer apparatus 701 can carry out the process for replacing the module in an easier process than the process described in the first embodiment.

In a modification of the fourth embodiment, in a computer apparatus, which comprises a CPU, a mask ROM and a RAM, there is no need to transfer a replacing slot before executing the program stored in the mask ROM. Thus, in this modification as well, the process for replacing the slot can easily be carried out.

Figure 13:
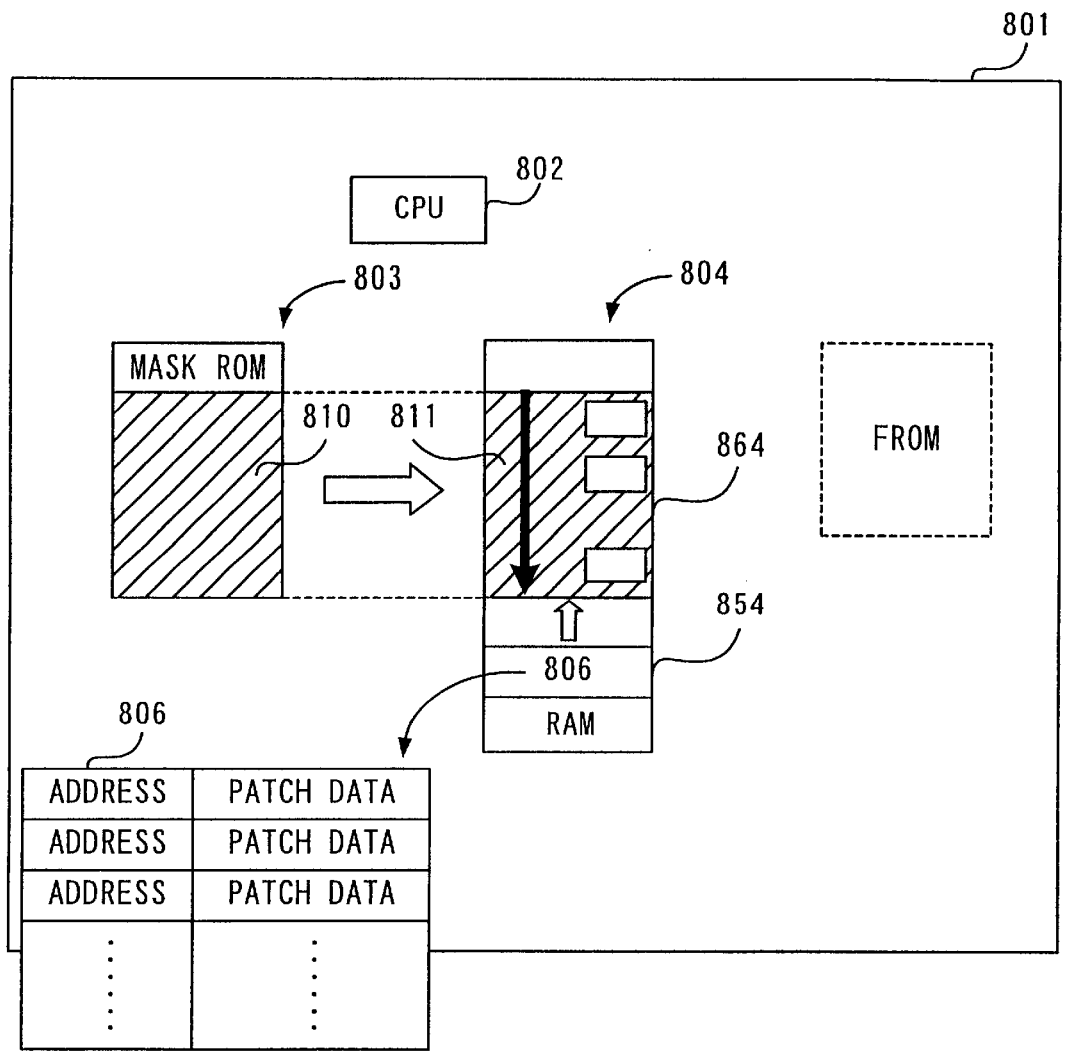
FIG. 13 is a block diagram for explaining operations of a computer apparatus according to a modification of the second embodiment.

In a modification of the second embodiment, a computer apparatus, which comprises a CPU, a mask ROM and a RAM, comprises a RAM 804 having one area 854 for storing a patch data table and a program area 864 for storing programs, as illustrated in FIG. 13.

After a power source is supplied, the CPU 802 transfers a program 810 stored in the mask ROM 802 into the program area 864 of the RAM 804.

Then, the CPU 802 corrects the transferred program 811, and executes the corrected program 811, based on the patch data table 806 stored in the one area 854 of the RAM 804.

As described above, the computer apparatus 801 corrects the program within the same RAM, thus the process for replacing the program can easily be carried out.

Figure 14:
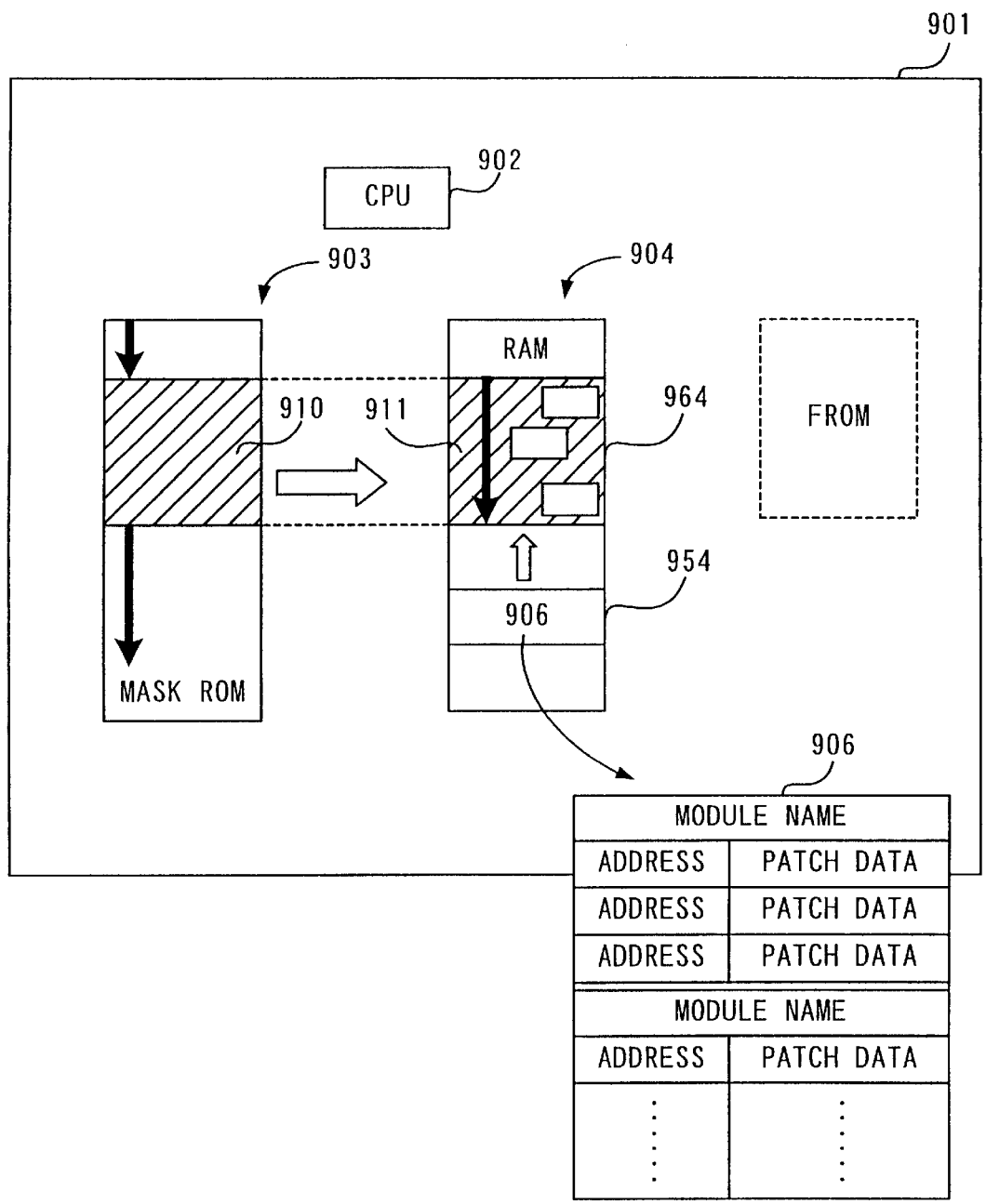
FIG. 14 is a block diagram for explaining operations of a computer apparatus according to a modification of the third embodiment.

As illustrated in FIG. 14, in a modification of the third embodiment, a computer apparatus, which comprises a CPU, a mask ROM and a RAM, comprises a RAM 904 including one area 954 for storing a patch data table and a module area 964 for storing a module.

After a power source is supplied, the CPU 902 transfers a target module 910 stored in the mask ROM 903 into the module area 964 of the RAM 904, based on the patch data table 906 stored in the one area 954 of the RAM 904.

Then, the CPU 902 corrects the transferred module 911 based on the patch data table 906.

When to execute the program stored in the mask ROM 903, the computer apparatus of this modification operates in the same manner as described in the third embodiment. Before executing the program, the computer apparatus corrects the program in the same RAM, thus the process for replacing the program can easily be carried out.

In a modification of the fifth embodiment, a computer, which comprises a CPU, a mask ROM and a RAM, corrects the program in the same RAM, before executing the program stored in the mask ROM. This realizes an easy process for replacing the program.

In the first, third, fourth and fifth embodiments, the explanations have been made to the computer apparatus wherein a single module or a single slot having a bug is replaced and patched with another module or slot. However, a plurality of modules or slots can be replaced with a plurality of modules or slots at a time.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-301211 filed on Oct. 22, 1999, and including specification, claims, drawings and summary. The disclosure of the above Japanese Patent Application is incorporated herein by reference in its entirety.

What is claimed is:

1. A data processing apparatus comprising:
   a read-only memory which stores a program composed of a plurality of modules each have a function:
   a writable non-volatile memory storing a replacing module in which an deficiency included in one of the plurality of modules is corrected;
   a random access memory which is readable and writable; and
   a controller which transfers the replacing module from said non-volatile memory into said random access memory, executes the program written in said read-only memory, reads and executes the replacing module stored in said random access memory without reading and executing the module with the deficiency.

2. The data processing apparatus according to claim 1, wherein each of said non-volatile memory and said random access memory includes a RAM (Random Access Memory) wherein the replacing module is written.

3. A data processing apparatus comprising:
   a read-only memory wherein a program to be executed is written;
   a writable non-volatile memory which stores correction data for correcting a deficiency which is included in the program;
   a random access memory which is readable and writable;
   a controller which copies the program stored in said read-only memory into said random access memory, corrects the deficiency included in the copied program in said random access memory using the correction data stored in said non-volatile memory, reads and executes the program which has been corrected and stored in said random access memory, and wherein said data processing apparatus executes the copied program while referring to an address thereof without referring to an address of the program stored in said read-only memory.

4. The data processing apparatus according to claim 3, wherein said read-only memory includes a mask ROM (read-only memory).

5. The data processing apparatus according to claim 3, wherein:

each of said non-volatile memory and said random access memory includes a RAM, in one area of which correction data is stored and in other area of which the program to be executed is copied by said controller; and said controller corrects the deficiency included in the copied program using the correction data stored in the one area of said random access memory.

6. A data processing apparatus comprising:

a read-only memory which stores a program composed of a plurality of modules each having a function;

a writable non-volatile memory which stores correction data for correcting a deficiency included in the program;

a random access memory which is readable and writable; and a controller which copies one of the plurality of modules with the deficiency stored in said read-only memory into said random access memory, corrects the deficiency in the copied module using the correction data stored in said non-volatile memory, executes the program stored in said read-only memory, reads and executes the corrected module stored in said random access memory without reading and executing the module with the deficiency.

7. The data processing apparatus according to claim 6, wherein:

each of said non-volatile memory and said random access memory includes a RAM, in one area of which the correction data is stored and into other area of which the program is copied; and said controller corrects the deficiency included in the copied program using the correction data stored in the one area of the random access memory.

8. A data processing apparatus comprising:

a read-only memory which stores a program composed of a plurality of equal-sized slots;

a writable non-volatile memory which stores a replacing slot in which a deficiency included in one of the plurality of slots is corrected;

a random access memory which is readable and writable; and a controller which transfers the replacing slot from said non-volatile memory into said random access memory, executes the program stored in said read-only memory, reads and executes the replacing slot stored in said random access memory without reading and executing the slot with the deficiency.

9. The data processing apparatus according to claim 8, wherein each of said non-volatile memory and said random access memory includes a RAM wherein the replacing slot is written.

10. A data processing apparatus comprising:

a read-only memory wherein a program composed of a plurality of equal-sized slots is stored;

a writable non-volatile memory which stores correction data for correcting a deficiency in the program;

a random access memory which is readable and writable; and a controller which transfers one of the plurality of slots having the deficiency from said read-only memory into said random access memory, corrects the transferred slot with the deficiency using the correction data stored in said non-volatile memory, executes the program stored in said read-only memory, and reads out and executes the corrected slot stored in said random access memory without reading and executing the slot with the deficiency.

11. The data process apparatus according to claim 10, wherein:

each of said non-volatile memory and said random access memory includes a RAM in one area of which the correction data is stored and in other area of which a target program to be executed by said controller is copied; and said controller corrects the deficiency in the copied target program using the correction data stored in the one area of the RAM.

* * * * *